(12) United States Patent
Wu

(10) Patent No.: US 6,462,372 B1
(45) Date of Patent: Oct. 8, 2002

(54) SCALED STACK-GATE FLASH MEMORY DEVICE

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 0 days.

(21) Appl. No.: 09/973,094

(22) Filed: Oct. 9, 2001

(51) Int. Cl.⁷ .............................................. H01L 29/76
(52) U.S. Cl. .................. 257/314; 257/315; 257/316; 257/317; 257/322; 257/324; 257/318; 438/20; 438/211; 438/258; 438/261; 438/264; 438/259; 365/185.05; 365/185.33; 365/185.24; 365/185.14; 365/185.3; 365/185.27
(58) Field of Search .................... 257/314–323, 257/214, 258, 336, 408, 345, 295, 298, 398; 438/20, 211, 258, 261, 264, 652, 655, 257, 259, 266–270, 589, 322; 365/185.05, 51, 63, 185.33, 185.24, 185.29, 185.14, 185.3, 185.27, 185.28

(56) References Cited

U.S. PATENT DOCUMENTS

| | | | |
|---|---|---|---|
| 4,698,787 A | | 10/1987 | Mukherjee et al. .......... 365/185 |
| 5,688,705 A | | 11/1997 | Bergemount ................. 437/43 |
| 6,008,089 A | | 12/1999 | Hong ............................ 438/259 |
| 6,020,257 A | * | 2/2000 | Leedy .......................... 438/626 |
| 6,038,171 A | * | 3/2000 | McElheny ............... 365/185.14 |
| 6,087,695 A | * | 7/2000 | Chen ............................ 257/314 |
| 6,218,689 B1 | | 4/2001 | Change et al. |
| 6,225,164 B1 | * | 5/2001 | Lim ............................. 438/264 |
| 2001/0008290 A1 | * | 7/2001 | Lim ............................. 257/315 |
| 2001/0019151 A1 | * | 9/2001 | Caywood ..................... 257/316 |

OTHER PUBLICATIONS

Seiichi Aritome, "Advanced Flash Memory Technology an Trends for File Storage Application", IEDM, pp. 763–766.
J. D. et al., Choi et al., A 0.15 um NAND Flash Technology with 0.11 um2 Cell Size for 1 Gbit Flash Memory; IEDM, pp. 767–770.
S. Wolf and R. N. Tauber, "Silicon Processing for the VlSi Era,", vol. 1–Process Technology, Lattice Press 1986, pp. 555–558 in Chapter 16.
Manufacturing Methods, pp. 641–650.

* cited by examiner

*Primary Examiner*—Nathan J. Flynn
*Assistant Examiner*—Fazli Erdem
(74) *Attorney, Agent, or Firm*—Powell, Goldstein, Frazer & Murphy, LLP

(57) ABSTRACT

A stack-gate structure including a masking dielectric layer over a control-gate layer over an intergate dielectric layer over a floating-gate layer formed on a gate-dielectric layer is formed on a semiconductor substrate having an active region isolated by field-oxides and is oxidized to form a first dielectric layer over the sidewalls of the control-gate layer, a second dielectric layer over the sidewalls of the floating-gate layer, and a thicker oxide layer over each side portion of the active region having a gradedoxide layer formed near two gate edges. An integrated source/drain landing island having a portion formed over a source/drain diffusion region for contact and an extended portion formed over a second dielectric layer and on a graded-oxide layer is acted as a field-emission cathode/anode. The scaled stack-gate flash memory device of the present invention can be programmed and erased through two-tunneling paths or one tunneling path without involving the channel region.

20 Claims, 7 Drawing Sheets

SCALED STACK-GATE FLASH MEMORY DEVICE

FIELD OF THE INVENTION

The present invention relates generally to a stack-gate flash memory device and more particularly to a scaled stack-gate flash memory device having an integrated source/drain landing island acted as a field-emission cathode/anode for erasing and programming without involving the channel region.

DESCRIPTION OF RELATED ART

The stack-gate structure is known to be a one-transistor structure for a flash memory device, in which the gate length can be defined by using the minimum-feature-size of technology used. Basically, a stack-gate flash memory device can be programmed by either channel hot-electron injection (CHEI) or Fowler-Nordheim tunneling, depending on the source and drain structure formed in a semiconductor substrate.

FIG. 1 shows a typical stack-gate structure used in the prior art, in which a double-diffused source structure is formed to offer a larger overlapping area for tunneling stored electrons from the floating-gate (FG) layer 102a to the deeper double-diffused source region 106a without inducing the band-to-band tunneling effects, and a shallow heavily-doped drain diffusion region 110a is used to tailor a peak electric field near the drain edge for channel hot-electron generation. From FIG. 1, it is clearly seen that the double-diffused source structure becomes an obstacle as the gate length is further scaled down because the punch-through effect becomes an important issue for device design. Moreover, the most of the drain current is wasted during programming and the programming time becomes a major concern for high-density mass storage applications.

FIG. 2 shows a much simpler stack-gate structure, in which a deeper source diffusion region 106a in a double-diffused source structure shown in FIG. 1 is deleted and a masking photoresist step for forming the deeper source diffusion region 106a isn't required. This structure is operated by tunneling electrons between the floating-gate layer 102a and the semiconductor substrate 100 for programming and erasing. It is clearly seen that the channel area for programming and erasing becomes smaller as the gate length is scaled down. As a consequence, the programming and erasing time will be longer as the gate-length becomes shorter.

Based on the above description, the stack-gate structure cann't be easily scaled down if the programming or erasing involves the channel region. It is, therefore, a major objective of the present invention to offer a stack-gate structure with an integrated source and drain landing island being acted as a field-emission cathode and anode for programming and erasing of a scaled stack-gate flash memory device without involving the channel region.

SUMMARY OF THE INVENTION

A stack-gate structure having a masking dielectric layer over a control-gate layer over an intergate dielectric layer over a floating-gate layer formed on a gate-dielectric layer is formed on a semiconductor substrate having an active region isolated by field-oxides and is oxidized to form a first dielectric layer over the sidewalls of the control-gate layer, a second dielectric layer over the sidewalls of the floating-gate layer, and a thicker oxide layer formed over each side portion of the active region having a graded-oxide layer formed near two gate edges. The floating-gate layer can be etched to have a taper angle being equal to or smaller than 90 degrees. A source/drain diffusion region is formed over each side portion of the active region. An integrated source/drain landing island including a portion formed on a source/drain diffusion region for contact and an extended portion formed over the second dielectric layer and on the graded-oxide layer is acted as a field-emission cathode/anode with respect to the sidewalls of the floating-gate layer and is oxidized. A dielectric spacer is formed over the sidewalls of the masking dielectric layer, the control-gate layer, and the intergate dielectric layer for self-aligned silicidation of the integrated source/drain landing island.

The scaled stack-gate flash memory device as described can be operated for erasing by tunneling electrons from the integrated source landing island into the floating-gate layer through two tunneling paths: one is from the extended portion of the integrated source landing island through the second dielectric layer; the other is from the overlapped source diffusion region through the gate-dielectric layer, and for programming by tunneling stored electrons from the floating-gate layer into the integrated drain landing island through two tunneling paths: one is from the floating-gate layer to the extended portion of the integrated drain landing island through the second dielectric layer; the other is from the floating-gate layer to the overlapped drain diffusion region through the gate-dielectric layer. As electrons are stored in the floating-gate layer for erasing, the threshold voltage of a scaled stack-gate flash memory device is high; as stored electrons are removed from the floating-gate layer for programming, the threshold voltage of a scaled stack-gate flash memory device is low.

The tunneling path from the source diffusion region to the floating-gate layer and the tunneling path from the floating-gate layer to the drain diffusion region can be prohibited if the thickness of the gate-dielectric layer is made to be thicker or the same as those used in peripheral devices. A scaled stack-gate flash memory device can be operated for programming and erasing with one tunneling path.

Therefore, the scaled stack-gate flash memory device of the present invention can be programmed and erased without involving the channel region and the gate length can be easily scaled down further for highdensity mass storage applications.

DETAILED DESCRIPTION OF THE PREFERRED EMBODIMENTS

Figure 1:
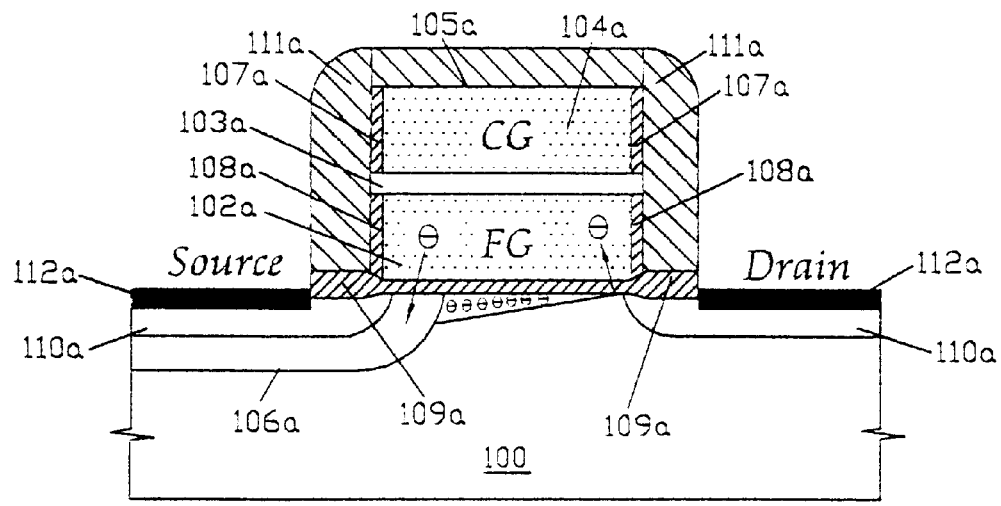
FIG. 1 shows a cross-sectional view of a stack-gate flash memory device of the prior art with a double-diffused source structure for programming using channel hot-electrons injection (CHEI) and for erasing using source-side tunneling.
Figure 2:
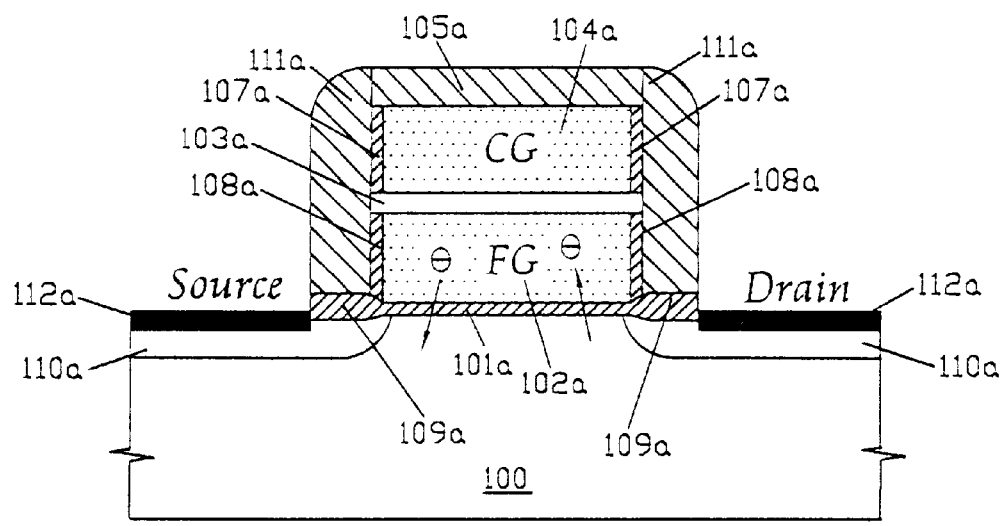
FIG. 2 shows a cross-sectional view of a stack-gate flash memory device of the prior art with a symmetrical source and drain structure for programming and erasing between the floating-gate layer and the semiconductor substrate.
Figure 3:
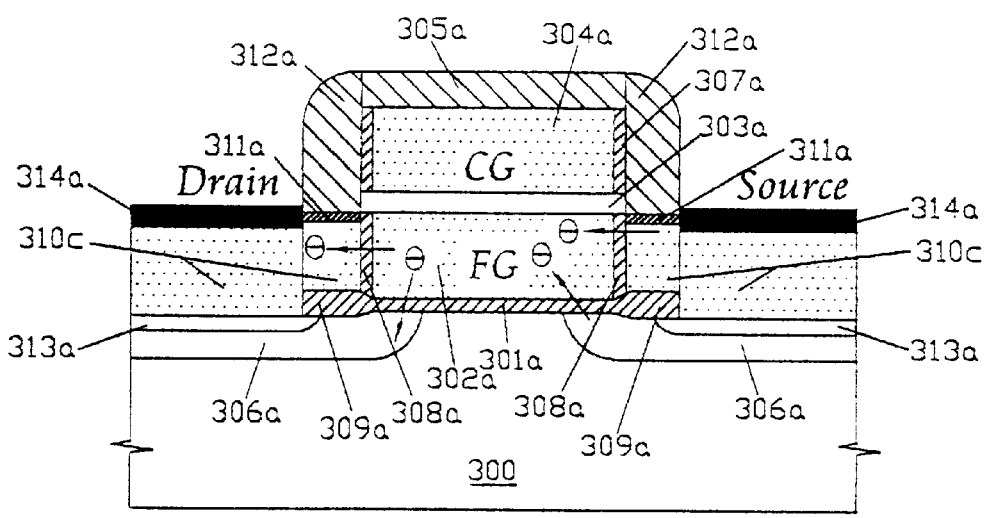
FIG. 3 shows a cross-sectional view of a stack-gate flash memory device of the present invention with an integrated source/drain landing island and a steep floating-gate layer.

Referring now to FIG. 3, there is shown a cross-sectional view of a scaled stack-gate flash memory device for the first embodiment of the present invention. As shown in FIG. 3, a stack-gate structure including a masking dielectric layer 305a over a control-gate layer (CG) 304a over an intergate dielectric layer 303a over a floating-gate layer (FG) 302a formed on a gate-dielectric layer 301a is formed on a semiconductor substrate 300 having an active region isolated by field-oxides (not shown ) and is oxidized to form a first dielectric layer 307a over the sidewalls of the control-gate layer 304a, a second dielectric layer 308a over the sidewalls of the steep floating-gate layer 302a, and a thicker oxide layer 309a over each side portion of the active region having a graded-oxide layer formed near two gate edges. A deeper source/drain diffusion region 306a is formed in each side portion of the active region. An integrated source/drain landing island 310c having a portion 310b formed on a deeper source/drain diffusion region 306a for contact and an extended portion 310a formed over the sidewalls of the second dielectric layer 308a and on the gradedoxide layer 309a is acted as the field-emission cathode/anode and is oxidized to form a poly-oxide layer 311a. A shallow source/drain diffusion region is formed by using the heavily-doped integrated source/drain landing island 310b as a dopant diffusion source. A dielectric spacer 312a is formed over the sidewalls of the first masking dielectric layer 305a, the first dielectric layer 307a, and the intergate dielectric layer 303a for performing self-aligned silicidation to form a self-aligned silicide layer 314a over a portion 311a of the integrated source/drain landing island 310c. It is clearly seen from FIG. 3 that the integrated source landing island 310c is acted as a field-emission cathode to tunnel electrons into the steep floating-gate layer 302a through the second dielectric layer 308a and the electrons in the overlapped portion of the deeper source drain diffusion region 306a may also tunnel across the gate-dielectric layer 301a into the steep floating-gate layer 302a. Similarly, the stored electrons in the floating-gate layer 302a may tunnel through the second dielectric layer 308a into the integrated drain landing island 310c and through the gate-dielectric layer 301a into the overlapped portion of the deeper drain diffusion region 306a. There are two tunneling paths for each side of the electrode, the programming and erasing speed of a scaled stack-gate flash memory device shown in FIG. 3 is much faster as compared to the prior art. Moreover, the programming and erasing operations of the present invention don't involve the channel region, the punch-through effect isn't an important issue for further scaling the gate length.

Figure 4:
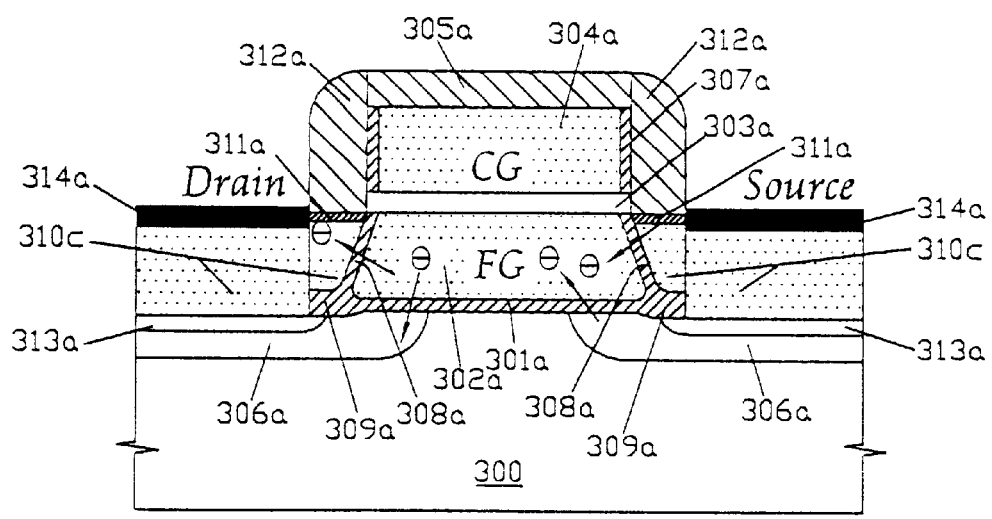
FIG. 4 shows a cross-sectional view of a stack-gate flash memory device of the present invention with an integrated source/drain landing island and a tapered floating-gate layer.

FIG. 4 shows a cross-sectional view of a scaled stack-gate flash memory device for the second embodiment of the present invention, in which a tapered floating-gate layer 302a is formed instead of a steep floating-gate layer shown in FIG. 3. Comparing between FIG. 3 and FIG. 4, it is clearly visualized that FIG. 4 offers a larger surface area over the sloped sidewalls of the tapered floating-gate layer 302a for tunneling electrons between the tapered floating-gate layer 302a and the extended portion 310a of the integrated source/drain landing islands 310c for a given thickness of the floating-gate layer. Moreover, the overlapping area between the tapered floating-gate layer 302a and the deeper source/drain diffusion region 306a is larger than that of the steep floating-gate layer shown in FIG. 3. As a result, the programming and erasing speed of a scaled stack-gate flash memory device shown in FIG. 4 is much faster as compared to that shown in FIG. 3. The operation mechanisms of FIG. 4 are the same as those discussed for FIG. 3. The process steps for fabricating a scaled stack-gate flash memory device shown in FIG. 3 and FIG. 4 are disclosed in FIG. 5A through FIG. 5G.

It should be noted that the tunneling path between the floating-gate layer 302a and a deeper source/drain diffusion region 306a shown in FIG. 3 and FIG. 4 can be prohibited by increasing the thickness of the gatedielectric layer 301a, the junction depth of the deeper source/drain diffusion region 306a can be made to be shallower, then the gate-length can be further scaled without concerning the punch-through effect. Note that the thickness of the gate-dielectric layer 301a can be made to be the same as those used in peripheral devices, the dual gate-oxide process used in existing art is therefore not required.

Based on the above description, the major advantages of the present invention over the prior arts are summarized below:

(a) A scaled stack-gate flash memory device is programmed and erased without involving the channel region, the gate length can be easily scaled down without concerning the punch-through effects;

(b) An integrated source/drain landing island of a scaled stack-gate flash memory device forms a field-emission cathode/anode for high-speed programming and erasing through two tunneling paths;

(c) A scaled stack-gate flash memory device having a tapered floating-gate layer offers a larger tunneling area for two tunneling paths, the faster-speed programming and erasing can be obtained for a scaled stack-gate flash memory device of the present invention; and (d) A scaled stack-gate flash memory device can be fabricated by using a thicker gate-dielectric layer to terminate the tunneling path between the floating-gate layer and the source/drain diffusion region. The thickness of the thicker gate-dielectric layer can be the same as that used in peripheral devices and the junction depth of the source/drain diffusion region can be made to be shallower for further scaling down the gate length.

Figure 5A:
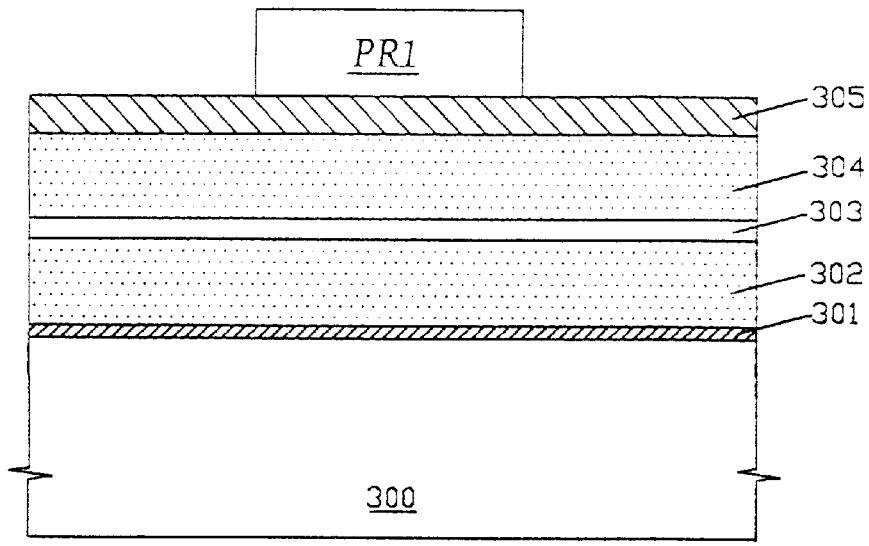
FIG. 5A through FIG. 5G show the process steps and their cross-sectional views for fabricating scaled stack-gate flash memory devices of the present invention shown in FIG. 3 and FIG. 4.

Now, referring to FIG. 5A through FIG. 5G, there are shown the process steps and their cross-sectional views for fabricating a scaled stack-gate flash memory device shown in FIG. 3 and FIG. 4. FIG. 5A shows that a multilayer structure including a masking dielectric layer 305, a control-gate layer 304, an intergate dielectric layer 303, a floating-gate layer 302, and a gate-dielectric layer 301 is formed on a semiconductor substrate 300 having an active region isolated by field-oxides. The field-oxide isolation is formed in the device-width direction having the floating-gate layer 302 formed and the extended floating-gate layer can be formed to increase the coupling ratio. Since the field-oxide isolation isn't a major concern of the present invention, the structure and the process are neglected. The masking dielectric-layer 305 is preferably a silicon-nitride layer deposited by low-pressure chemical-vapor-deposition (LPCVD). The control-gate layer 304 can be a doped polycrystalline-silicon layer capped with a tungsten-silicide layer or other composite metal layer. The intergate dielectric layer 303 is preferably an oxide-nitride-oxide (ONO) structure or a nitride-oxide structure. The floating-gate layer 302 is preferably a doped polycrystallinesilicon or doped amorphous-silicon layer. The gate-dielectric layer is preferably an oxide layer or a nitrided-oxide layer. As shown in FIG. 5A, a patterned photoresist PRI is formed to define the gate-length of a stack-gate flash memory device.

Figure 5B:
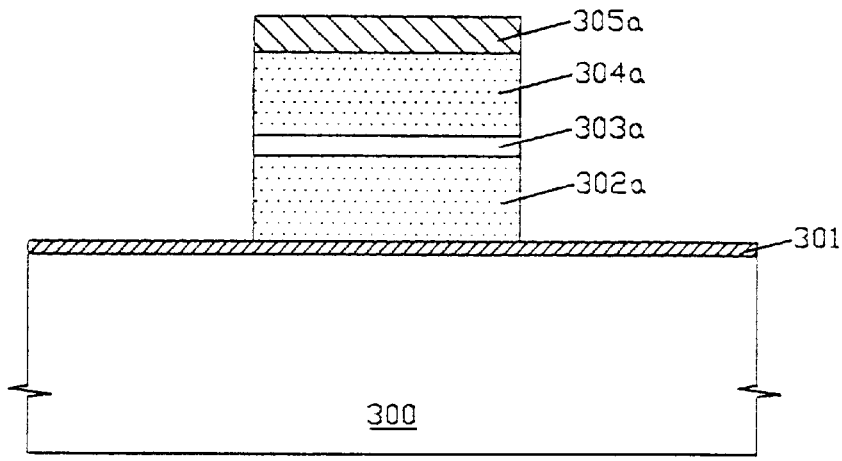
Figure 5B:
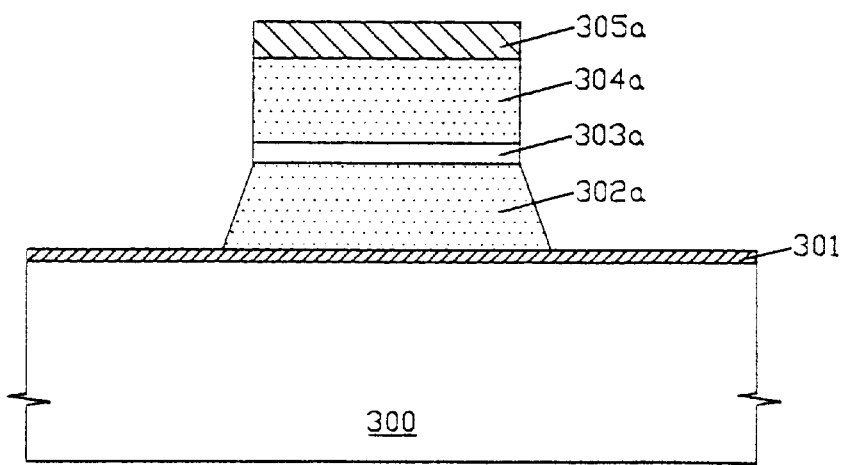

FIG. 5B(a) shows that the gate region is patterned by anisotropic dry etching to form a stack-gate structure having a masking dielectric layer 305a over a control-gate layer 304a over an intergate layer 303a over a floating-gate layer 302a formed on a gate-dielectric layer 301. However, FIG. 5B(b) shows that the floating-gate layer 302a is formed by a taper etching with a taper angle between about 45 degrees and 90 degrees.

Figure 5C:
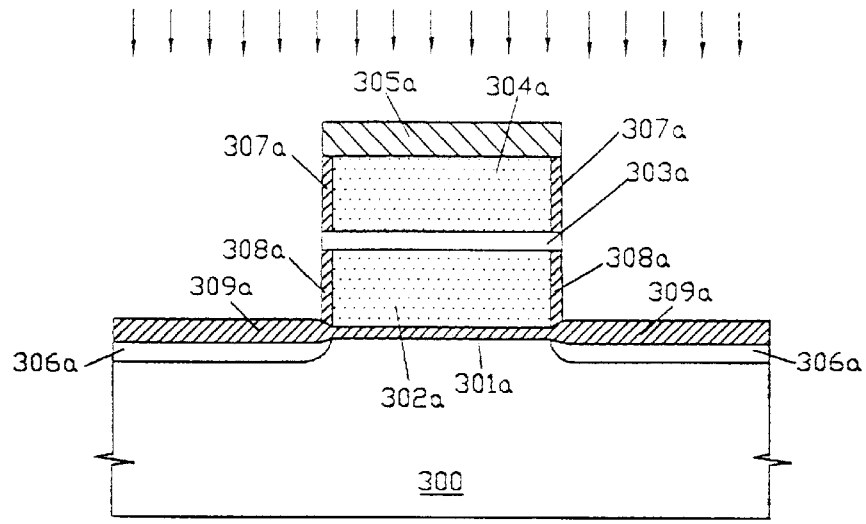
Figure 5C:
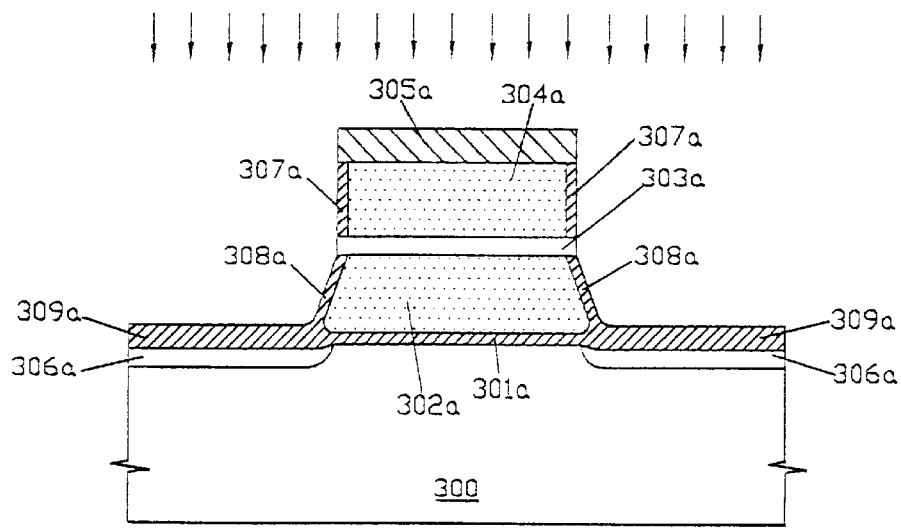

FIG. 5C(a) and FIG. 5C(b) show a stack-gate structure shown in FIG. 5B(a) and FIG. 5B(b) being oxidized to form a first dielectric layer 307a over the sidewalls of the control-gate layer 304a, a second dielectric layer 308a over the sidewalls of the steep or tapered floating-gate layer 302a, and a thicker oxide layer 309a over each side portion of the active region having a graded-oxide layer formed near two gate edges. A moderate dose of doping impurities is implanted into each side portion of the active region in a self-aligned manner to form a source/drain diffusion region 306a. Note that the above implantation can be performed before or after oxidizing the stack-gate structure. The doping impurities can be phosphorous impurities for forming a deeper source/drain diffusion region or arsenic impurities for forming a shallow source/drain diffusion region for a p-type semiconductor substrate 300.

Figure 5D:
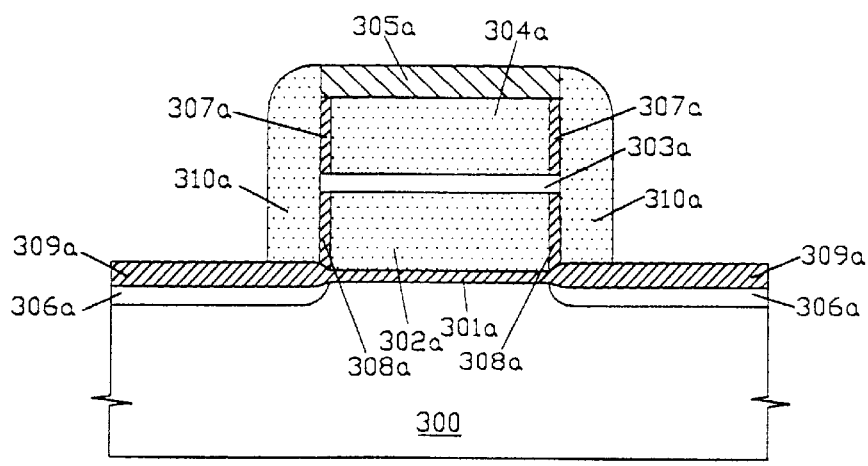
Figure 5D:
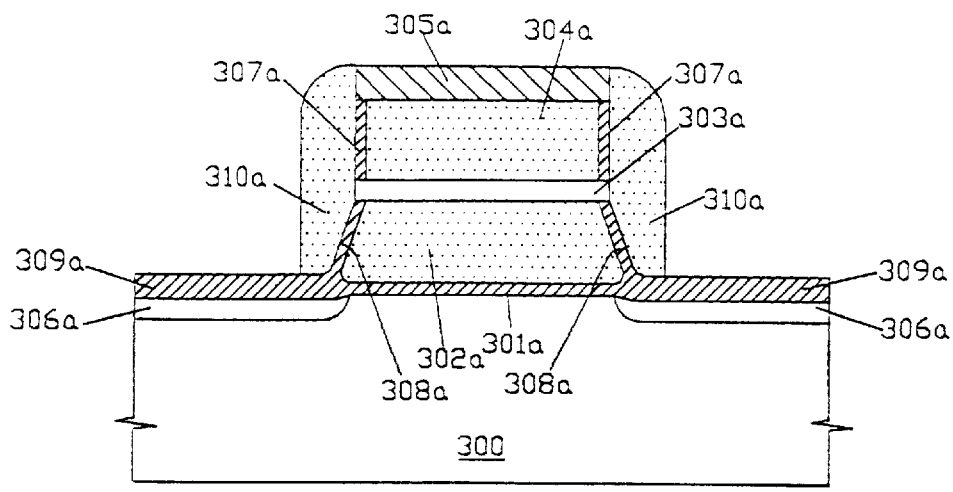

FIG. 5D(a) and FIG. 5D(b) show that a conductive spacer 310a is formed over the sidewalls of a stack-gate structure shown in FIG. 5C(a) and FIG. 5C(b), respectively. The conductive spacer 310a is preferably a polycrystalline-silicon or amorphous-silicon layer deposited by LPCVD. The conductive spacer 310a is not only served as an etching mask to define a self-aligned source/drain contact but also acted as an extended portion of the integrated source/drain landing island 310c, as will be shown later.

Figure 5E:
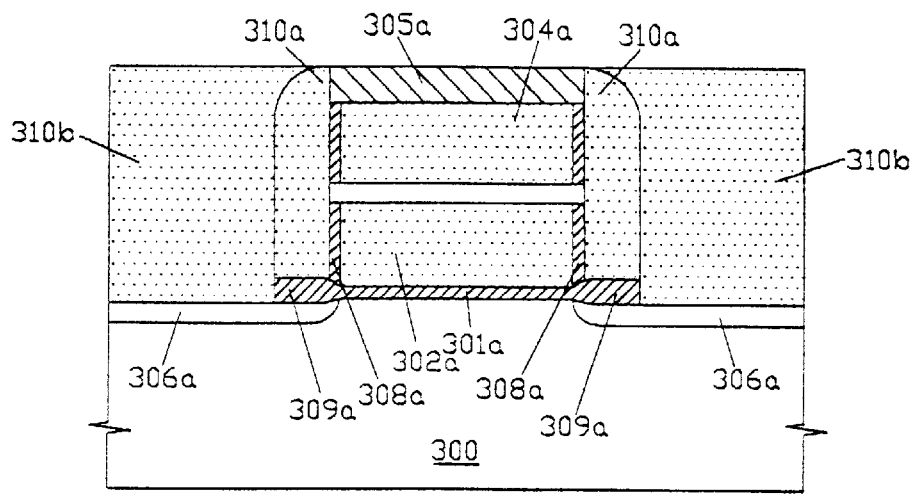
Figure 5E:
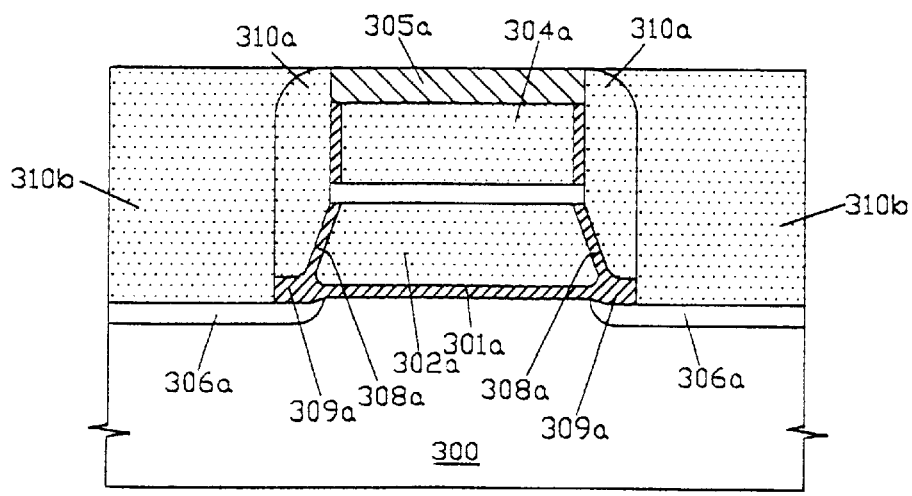

FIG. 5E(a) and FIG. 5E(b) show that a self-aligned source/drain contact is etched in a self-aligned manner and a planarized conductive layer 310b is formed over the self-aligned source/drain contact hole. The planarized conductive layer 310b is preferably made of polycrystalline-silicon or amorphous-silicon deposited by LPCVD and the planarization can be preferably performed by chemical-mechanical polishing (CMP) with the masking dielectric layer 305a as a polishing stop.

Figure 5F:
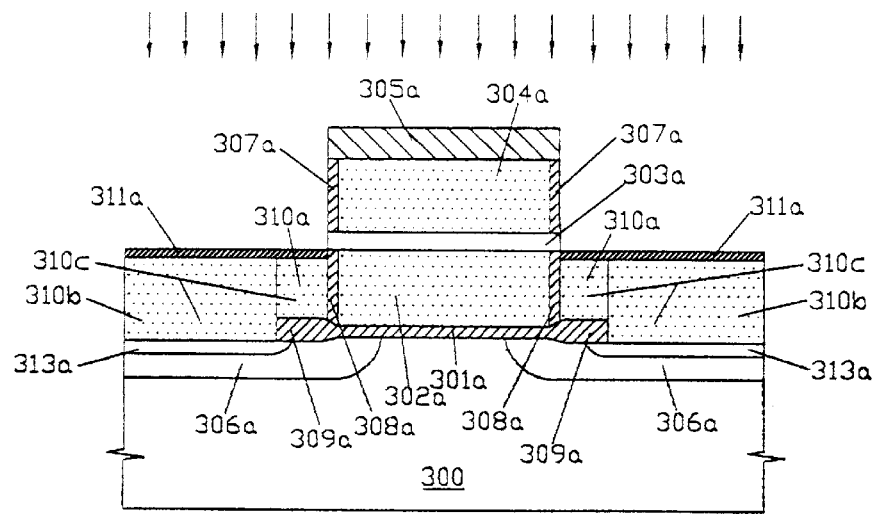
Figure 5F:
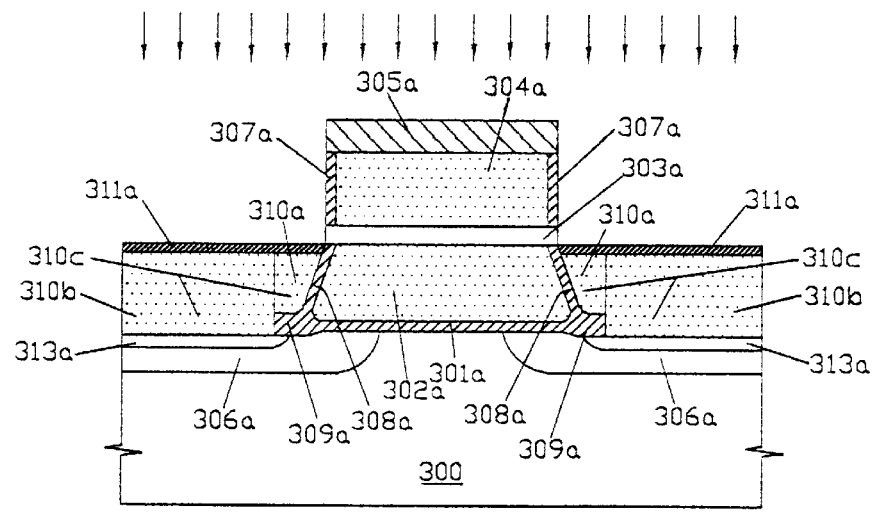

FIG. 5F(a) and FIG. 5F(b) show that the structures in FIG. 5E(a) and FIG. 5E(b) are etched back to a level approximately equal to the top level of the floating-gate layer 302a to form an integrated source/drain landing island 310c, a thermal oxidation is performed to form a poly-oxide layer 311a over the integrated source/drain landing island 310c, and a high-dose of doping impurities is implanted into the integrated source/drain landing island 310c being acted as a dopant diffusion source for forming a shallow source/drain diffusion region 313a. A rapid thermal annealing is performed to redistribute the doping impurities in the integrated source/drain landing island 310c and the source/drain diffusion region 306a, 313a.

Figure 5G:
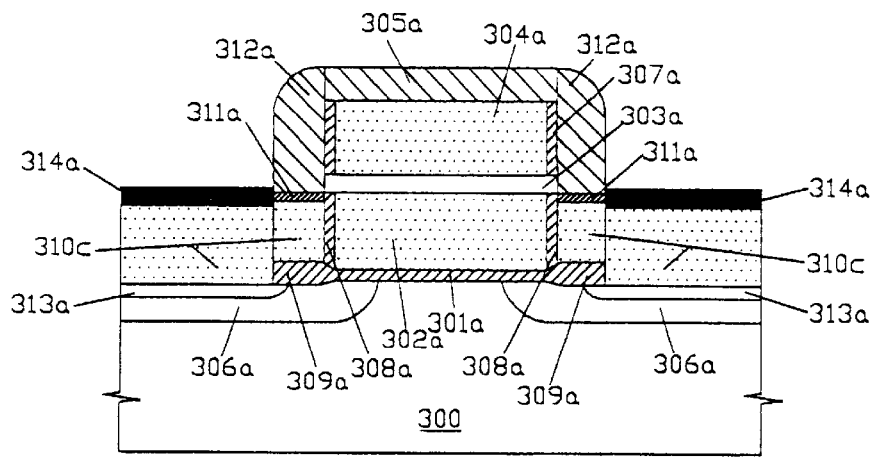
Figure 5G:
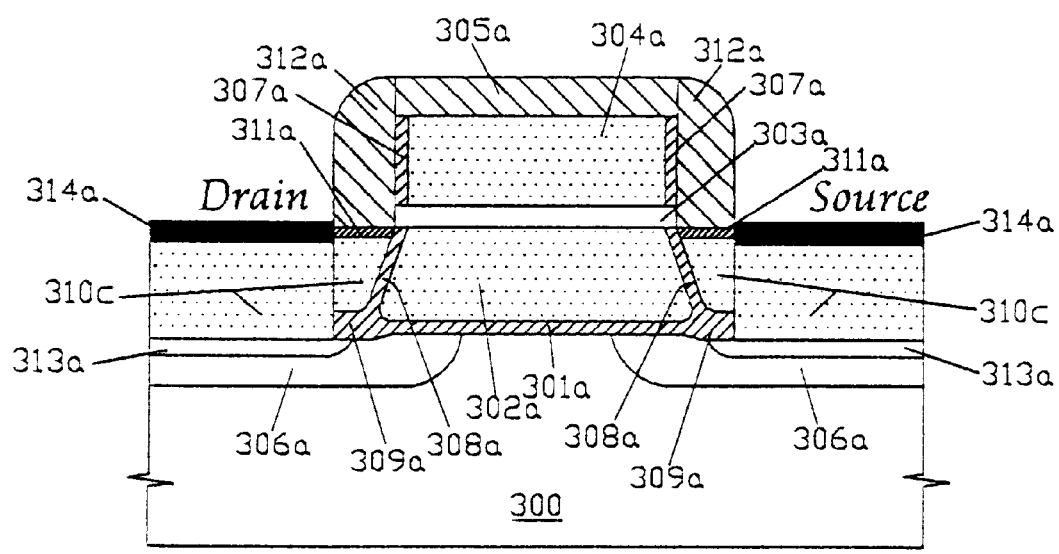

FIG. 5G(a) and FIG. 5G(b) show that a dielectric spacer 312a is formed over the structure shown in FIG. 5F(a) and FIG. 5F(b) and the poly-oxide layer 311a outside of the dielectric spacer 312a is removed in a self-aligned manner. A self-aligned silicidation is then performed to form a self-aligned silicide layer 314a over the exposed portion of the integrated source/drain landing island 310c, as also shown in FIG. 3 and FIG. 4. Note that the dielectric spacer 312a is preferably made of silicon-nitrides deposited by LPVCD and a self-aligned silicide layer 314a is preferably a refractory metal-silicide layer such as $TiSi_2$, $COSi_2$, $TaSi_2$, $MOSi_2$, $WSi_2$ or $PtSi_2$.

Similarly, the process steps for fabricating a scaled stack-gate flash memory device with one tunneling path for programming and erasing as described previously can be easily obtained by two changes: one is to use a thicker gate-dielectric layer 301a for the stack-gate structure, the thickness of the gate-dielectric layer 301a can be the same as those used in peripheral devices; the doping impurities for forming a deeper source/drain diffusion region 306a are changed from phosphorous impurities into arsenic impurities for forming shallower source/drain diffusion region 306a. While the present invention has been particularly shown and described with reference to the present examples and embodiments as considered as illustrative and not restrictive. Moreover, the present invention is not to be limited to the details given herein, it will be understood by those skilled in the art that various changes in form and detail may be made without departure from the true spirit and scope of the invention.

What is claimed is:

1. A scaled stack-gate flash memory device comprising:
    a stack-gate structure being formed on a semiconductor substrate having an active region isolated by field-oxides, said stack-gate structure includes a masking dielectric layer over a control-gate layer over an inter-gate dielectric layer over a floating-gate layer formed on a gatedielectric layer;
    said stack-gate structure being oxidized to have a first dielectric layer formed over sidewalls of said control-gate layer, a second dielectric layer formed over sidewalls of said floating-gate layer, and a thicker oxide layer formed over each side portion of said active region having a graded-oxide layer formed near two gate edges;
    a source/drain diffusion region being formed in a self-aligned manner in said side portion of said active region;
    an integrated source/drain landing island being formed to have a portion formed over said source/drain diffusion region for contact and an extended portion formed over said second dielectric layer and on said graded-oxide layer;
    a dielectric spacer being formed over sidewalls of said masking dielectric layer, said first dielectric layer, and said intergate dielectric layer, and on a thermal poly-oxide layer formed on a portion of said integrated source/drain landing island; and
    a self-aligned contact being formed on said integrated source/drain landing island.

2. A scaled stack-gate flash memory device of claim 1, wherein said integrated source/drain landing island is preferably made of doped polycrystalline-silicon or doped amorphous-silicon and is acted as a field-emission cathode/anode with respective to said floating-gate layer.

3. A scaled stack-gate flash memory device of claim 1, wherein said second dielectric layer formed over said sidewalls of said floating-gate layer is preferably a thermal poly-oxide or nitrided thermal poly-oxide layer and is acted as a tunneling-dielectric layer between said integrated source/drain landing island and said floating-gate layer.

4. A scaled stack-gate flash memory device of claim 1, wherein said gate-dielectric layer is preferably a thermal-oxide or nitrided thermal-oxide layer and is acted as a tunneling-dielectric layer between said floating-gate layer and said source/drain diffusion region.

5. A scaled stack-gate flash memory device of claim 1, wherein said floating-gate layer is preferably made of doped polycrystalline-silicon or doped amorphous-silicon and is acted as a field-emission anode with respect to said integrated source landing island or said source diffusion region and is acted as a field-emission cathode with respect to said integrated drain landing island or said drain diffusion region.

6. A scaled stack-gate flash memory device of claim 1, wherein said source/drain diffusion region is consisting of a shallow source/drain diffusion region formed within a deeper source/drain diffusion region; said deeper source/drain diffusion region is doped by implanting a moderate dose of phosphorous impurities and said shallow source/drain diffusion region is heavily doped with arsenic impurities either using said integrated source/drain landing island as a dopant diffusion source or by implanting a high-dose of arsenic impurities.

7. A scaled stack-gate flash memory device of claim 1, wherein said scaled stack-gate memory device is operated by tunneling electrons from said integrated source landing island through said second dielectric layer and said source diffusion region through said gate dielectric layer into said floating-gate layer for erasing operation, and is operated by tunneling stored electrons from said floating-gate layer through said second dielectric layer to said integrated drain landing island and through said gate-dielectric layer into said drain diffusion region for programming operation.

8. A scaled stack-gate flash memory device comprising:
a stack-gate structure being formed on a semiconductor substrate having an active region isolated by field-oxides, said stack-gate structure includes a masking dielectric layer over a control-gate layer over intergate dielectric layer over a tapered floating-gate layer formed on a gatedielectric layer;
said stack-gate structure being oxidized to have a first dielectric layer formed over sidewalls of said control-gate layer, a second dielectric layer formed over sloped sidewalls of said tapered floating-gate layer, and a thicker oxide layer formed over each side portion of said active region having a graded-oxide layer formed near two gate edges;
a source/drain diffusion region being formed in a self-aligned manner in said side portion of said active region, said source/drain diffusion region includes a shallow source/drain diffusion region formed within a deeper source/drain diffusion region;
an integrated source/drain landing island being formed to have a portion formed over said shallow heavily-doped source/drain diffusion region for contact and an extended portion formed over said second dielectric layer and on said graded-oxide layer;
a dielectric spacer being formed over sidewalls of said masking dielectric layer, said first dielectric layer, and said intergate dielectric layer, and on a thermal poly-oxide layer formed on a portion of said integrated source/drain landing island; and
a self-aligned contact being formed on said integrated source/drain landing island.

9. A scaled stack-gate flash memory device of claim 8, wherein said tapered floating-gate layer is preferably made of doped polycrystalline-silicon or doped amorphous-silicon and is formed by a taper etching with a taper angle between about 45 degrees and 90 degrees.

10. A scaled stack-gate flash memory device of claim 8, wherein said second dielectric layer formed over said sidewalls of said tapered floating-gate layer is preferably a thermal poly-oxide or nitrided thermal poly-oxide layer and is acted as a tunneling-dielectric layer between said integrated source/drain landing island and said tapered floating-gate layer.

11. A scaled stack-gate flash memory device of claim 8, wherein said gate-dielectric layer is preferably a thermal-oxide or nitrided thermal oxide layer and is acted as a tunneling-dielectric layer between said tapered floatinggate layer and said source/drain diffusion region.

12. A scaled stack-gate flash memory device of claim 8, wherein said source/drain diffusion region is formed by implanting a moderate dose of phosphorous impurities and said shallow source/drain diffusion region is formed either using said integrated source/drain landing island as a dopant diffusion source or by implanting a high-dose of arsenic impurities.

13. A scaled stack-gate flash memory device of claim 8, wherein said stack-gate flash memory device is operated by tunneling electrons from said integrated source landing island through said second dielectric layer and said deeper source diffusion region through said gate-dielectric layer into said tapered floating-gate layer for erasing operation, and is operated by tunneling stored electrons from said tapered floating-gate layer through said second dielectric layer into said integrated drain landing island and through said gate-dielectric layer into said deeper drain diffusion region for programming operation.

14. A scaled stack-gate flash memory device of claim 7 or claim 13, wherein for said erasing operation, said floating-gate layer or said tapered floating-gate layer is stored with electrons and said scaled stack-gate flash memory device having a high threshold voltage is off for a reading operation; for said programming operation, stored electrons in said floating-gate layer or said tapered floating-gate layer are removed through tunneling to said integrated drain landing island and said drain diffusion region or said deeper drain diffusion region and said scaled stack-gate flash memory device having a low threshold voltage is on for a reading operation.

15. A scaled stack-gate flash memory device comprising:
a stack-gate structure being formed on a semiconductor substrate having an active region isolated by field-oxides, said stack-gate structure including a masking dielectric layer over a control-gate layer over an inter-gate dielectric layer over a tapered floating-gate layer formed on a thicker gate-dielectric layer;
said stack-gate structure being oxidized to have a first dielectric layer formed over sidewalls of said control-gate layer, a second dielectric layer formed over sloped sidewalls of said tapered floating-gate layer, and a thicker oxide layer formed over each side portion of said active region having a graded-oxide layer formed near two gate edges;
a source/drain diffusion region being formed in a self-aligned manner in said side portion of said active region; said source/drain diffusion region includes a shallow source/drain diffusion region formed within a deeper source/drain diffusion region;
an integrated source/drain landing island being formed to have a portion formed over said shallow source/drain diffusion region for contact and an extended portion formed over said second dielectric layer and on said graded-oxide layer;
a dielectric spacer being formed over sidewalls of said masking dielectric layer, said first dielectric layer, and said intergate dielectric layer, and on a thermal poly-oxide layer formed on a portion of said integrated source/drain landing island; and
a self-aligned contact being formed on said integrated source/drain landing island.

16. A scaled stack-gate flash memory device of claim 15, wherein said tapered floating-gate is made of doped polycrystalline-silicon or doped amorphous-silicon and is formed to have a taper angle equal to or smaller than 90 degrees.

17. A scaled stack-gate flash memory device of claim 15, wherein said a thicker gate-dielectric layer is preferably a thermal-oxide or nitrided thermal-oxide layer with a thickness being thicker or equal to those used in peripheral devices.

18. A scaled stack-gate flash memory device of claim 15, wherein said deeper source/drain diffusion region is formed by implanting a moderate dose of arsenic impurities and said shallow source/drain diffusion region is formed either using said integrated source/drain landing island as a dopant diffusion source or by implanting a high-dose of arsenic impurities.

19. A scaled stack-gate flash memory device of claim 15, wherein said second dielectric layer is a thermal poly-oxide or nitrided thermal poly-oxide layer and is acted as a tunneling-dielectric layer between said tapered floating-gate layer and said integrated source/drain landing island.

20. A scaled stack-gate flash memory device of claim 15, wherein said scaled stack-gate flash memory device is operated by tunneling electrons from said integrated source landing island through said second dielectric layer into said tapered floating-gate layer for erasing operation, and is operated by tunneling stored electrons from said tapered floating-gate layer through said second dielectric layer into said integrated drain landing island for programming operation.

* * * * *